United States Patent [19]

Tonai

[11] Patent Number: 5,053,837
[45] Date of Patent: Oct. 1, 1991

[54] INGAAS/INP TYPE PIN PHOTODIODES

[75] Inventor: Ichiro Tonai, Osaka, Japan

[73] Assignee: Sumitomo Electric Industries, Ltd., Osaka, Japan

[21] Appl. No.: 439,008

[22] Filed: Nov. 20, 1989

Related U.S. Application Data

[63] Continuation-in-part of Ser. No. 244,177, Sep. 14, 1987, abandoned.

[30] Foreign Application Priority Data

Sep. 16, 1987 [JP] Japan .............................. 63-231423

[51] Int. Cl.$^5$ .............................................. H01L 33/00
[52] U.S. Cl. ........................................ 357/17; 357/16; 357/55; 357/30; 357/58; 357/52
[58] Field of Search ............... 357/30 A, 30 E, 30 Q, 357/30 R, 16, 55, 17, 30 P, 58

[56] References Cited

U.S. PATENT DOCUMENTS

| | | | |
|---|---|---|---|
| 4,367,368 | 1/1983 | Wolf | 357/30 R |
| 4,455,351 | 1/1984 | Combel | 357/30 R |
| 4,656,494 | 4/1987 | Kobayashi et al. | 357/30 R |
| 4,740,819 | 4/1988 | Ouchi et al. | 357/16 |
| 4,814,847 | 3/1989 | Tabatabaie | 357/52 |

FOREIGN PATENT DOCUMENTS

| | | | |
|---|---|---|---|
| 0072084 | 5/1980 | Japan | 11/30 A |
| 0084590 | 5/1984 | Japan | 11/30 E |
| 0222972 | 12/1984 | Japan | 11/30 A |
| 0086877 | 5/1985 | Japan | 11/30 E |
| 0130871 | 7/1985 | Japan | 357/30 |
| 0147786 | 7/1987 | Japan | 11/30 E |
| 62-254473 | 11/1987 | Japan | 357/35 P |

OTHER PUBLICATIONS

"Reliability of InGaAs/InP Long-Wavelenth p-i-n Photodiodes with Polymide Thin Film," Y. Kuhara et al., Journal of Lightwave Technology, vol. LT-4, No. 7, Jul. 1986, pp. 933-937.
"First Life-Test Results on Planar p-i-n InGaAs/InP Photodiodes Passivated with SiO$_2$ or SiN$_x$+SiO$_2$ or SiN$_x$ Layers".
G. Ripoche et al., IEE Electron Device Letters. Vol. EDL-6, No. 12, Dec. 1985, pp. 631-633.
"Failure Mode Analysis of Planar Zinc-Diffused In$_{0.53}$Ga$_{0.47}$As P-i-n Photodiodes," A. K. Chin et al., J. Applied Physics 55(b), 15 Mar. 1984, pp. 1596-1606.
"Very High-Speed Back-Illuminated InGaAs/InP PIN Punch-Through Photodiodes," Electronic Letters, 11 Jun. 1981, vol. 17, No. 12, pp. 431-432.
"Low Dark Current, High Efficiency Planar In$_{0.53}$Ga$_{0.47}$As/InP p-i-n Photodiodes," S. R. Forrest et al., IEEE Electron Device Letters, Vol. EDL-2, No. 11, Nov. 1981, pp. 283-285.

Primary Examiner—Andrew J. James
Assistant Examiner—Hung Xuan Dang
Attorney, Agent, or Firm—Kenyon & Kenyon

[57] ABSTRACT

An InGasAs/InP type PIN photodiode including an n-InP substrate, an n-InGaAs layer arranged on a surface of the substrate and a p-InGaAs layer comprising a portion of the n-InGaAs layer diffused with a p-type impurity. A ring-like p-electrode is arranged to encircle the p-InGaAs layer and a portion of the p-InGaAs layer encircled by the p-electrode is formed to a recess having a depth of less than 2.0 μm. In addition, the thickness of the p-InGaAs layer is formed to be larger than 3.0 μm. The PIN photodiode is arranged so that light is introduced into the recess.

8 Claims, 5 Drawing Sheets

INGAAS/INP TYPE PIN PHOTODIODES

This application is a continuation of application Ser. No. 244,177, filed 9-14-88 now abandoned.

BACKGROUND OF THE INVENTION:

1. Field of the Invention

This invention relates to InGaAs/InP type PIN photodiodes.

In optical communication, photodiodes are frequently used as photo-detecting elements. The requirements for such photodiodes are that they have high sensitivity and low dark current and further that they can readily be manufactured.

2. Description of the Prior Art

The structure of a conventional InGaAs/InP type PIN photodiode is first described by reference to FIG. 2.

This photodiode has a multi-layered structure formed by epitaxially growing on an n-InP substrate 21 and n-InP buffer layer 22, an n-InGaAs photo-detecting layer 23 and an n-InP window layer 24.

A Zn diffusion region 25 is further provided in the center portion of the n-InP window layer 24 whereby this portion is changed from n-type to p-type. The Zn diffusion region 25 extends to the n-InGaAs photo-detecting layer 23 to form a p-n junction 40.

Further provided on the surface of the Zn diffusion region 25 is a ring-like p-electrode 27 in which a window is provided to allow the incidence of light, the window being coated with an AR (antireflection)-film coating 28.

An n-electrode 26 is also provided by the vaccum evaporation process on the opposite end surface of the InP substrate 21.

Light enters through the AR-film coating 28 into the interior of the element. The window layer 24 consists of InP, band gaps of which are larger than those of InGaAs, and is rather thin. Accordingly, the amount of light absorbed at the layer 24 is relatively small.

Since the portions corresponding to the Zn diffusion region 25 is of p-type, the InP window layer 24 and InGaAs photo-detecting layer 23 may also be referred to as p-InP window layer 29 and p-InGaAs photo-detecting layer 30, respectively.

With this arrangement, light absorbed in the InGaAs photo-detecting layers 30, 23. If the energy of the light is larger than the band gap, pairs of electrons and holes are excited, and these pairs are accelerated under the influence of the electric field of the p-n junction 40.

The electrons drift to the n-electrode 26 through the n-InGaAs photo-detecting layer 23, the n-InP buffer layer 22 and the n-InP substrate 21.

The reason for the provision of the window 24 is as follows:

Minority carriers generated in the InGaAs photo-detecting layer 23 cannot pass over hetero-barrier 31 of the heteroplane 31 between the InGaAs layer 23 and InP layer 24. Therefore, the minority carriers cannot reach the surface of the element and thus surface recombination can be prevented. Moreover, the possibility of recombination at the heteroplane is also low. Thus, recombination of the minority carriers does not occur even in the vicinity of the heteroplane. It is, therefore, possible to efficiently take out the minority carriers generated in the photo-detecting layer. In this manner, the band barrier 31 of the heteroplane has an important function. That is why the window layer 24 is necessary.

The structure shown in FIG. 2 is arranged to introduce light from the window layer 29 of the p-type region, but there is another conventional structure as shown in FIG. 3 wherein light is introduced from the n-type substrate 41.

In the conventional example of FIG. 3, an n-InGaAs photo-detecting layer 32 is epitaxially grown on an n-InP substrate 41. A Zn diffusion region 33 is then formed on the n-InGaAs photo-detecting layer 32 whereby the region 33 changes from n-type to p-type InGaAs. Further, a p-electrode 34 is provided by the vacuum evaporation process on an upper surface of the Zn diffusion region 33.

Similarly, on the bottom surface of the n-InP substrate 41, a ring-like n-electrode 35 is provided by the vacuum evaporation process and it is provided therein with a light incidence surface having an AR coating 36.

The incident light enters from the bottom surface through the n-InP substrate 41 and the InGaAs photo-detecting layer 32 to a p-n junction area 37 to excite pairs of electrons and holes in that area. The pairs of electrons and holes are then accelerated and separated under the influence of the electric field of the p-n junction area 37. The electron drifts from the n-InGaAs photo-detecting layer 32 through the n-InP substrate 40 to the n-electrode 35 to generate external current.

The holes also drift through the p-InGaAs photo-detecting layer 33 to the p-electrode 34 in the vicinity of which the holes are recombined with electrons. Electrons are supplied from the p-electrode 34 to generate external current.

Drawbacks of the Prior Art

The photodiode of FIG. 2 is advantageous in that the light incident surface and the active region are positioned adjacent to each other so that there is little chance that light is absorbed at an inactive region thereby improving quantum efficiency and thus detection sensitivity. There is a further advantage in that the minority carriers cannot be diffused to the surface of the window layer due to the hetero-barrier 31.

However, it is difficult to achieve the epitaxial growth of the n-InP window layer 24 on the n-InGaAs photo-detecting layer 23 and further to achieve the epitaxial growth of the n-InP buffer layer 22, n-InGaAs photo-detecting layer 23 and n-InP window layer 24 on the n-InP substrate 21.

In the type as shown in FIG. 3 in which incident light enters from the InP substrate 41, the thickness of the InP substrate 41 is so large that light of any wavelength, especially short wavelength (about 0.9 μm) is absorbed.

Since the band gap of InP is larger than that of InGaAs, light having an energy level intermediate between both of the band gaps can pass through the substrate 41. However, almost all of light having an energy level higher than the band gap of InP will be absorbed at the substrate 41.

Eventually, the element is only sensitive to light, the wavelength of which is longer than that of the absorption limit of InP.

The structure as shown in FIG. 3 is unsuitable to provide sensitivity to a wider range of wavelengths of light.

SUMMARY AND OBJECTS OF THE INVENTION

Approach from the Prior Art to the Invention

Accordingly, the inventor has conducted research in order to improve the photodiode having the structure of FIG. 2, as described hereinbelow. Since the conventional example of FIG. 2 has difficulty in attaining the epitaxial growth of the n-InP window layer 24, it may be proper to remove said window layer 24. It may further be proper to constitute the uppermost layer with the InGaAs layer 23 in which Zn is diffused to form the p-n junction. This is just like the arrangement shown in FIG. 3 except that the incident light is directed from above.

However, there has not hitherto been produced a photodiode such as that shown in FIG. 3 which has no part corresponding to the InP window layer 24 in FIG. 2 and in which light enters from above into the p-InGaAs layer 33. This resulted from the thought that the surface recombination velocity was too large to provide the required sensitivity because the structure in FIG. 3 has no window layer for minimizing the effect of surface recombination.

The inventor firstly studied the effect of surface recombination velocity (S) on sensitivity by making theoretical calculations. As a result, it was found that if (S) was in the order of about $10^4$–$10^5$ cm/sec (see FIG. 4), photodiodes having high sensitivity could readily be manufactured. It was, however, not known what the surface recombination velocity of the p-InGaAs layer 33 itself was.

Secondly, the inventor produced samples with varied thicknesses of p-InGaAs layer 33 to measure sensitivity. The results are shown in FIG. 4. From this graph, it can be observed that the surface recombination velocity of the p-InGaAs layer 33 is approximately $10^4$ cm/sec. It is also found that if the p-InGaAs layer 33 is less than 2 $\mu$m thick, the photodiode has sufficient sensitivity as a photo-detector.

In the process of making the samples, however, it is found that when the depth of the Zn diffusion is decreased in order to reduce the thickness of the p-InGaAs layer 33 the dark current (Id) simultaneously increases. The results of measuring dark current in cases in which diffusion depths are 1 $\mu$m and 3.5 $\mu$m are shown in FIG. 6.

In the case of the diffusion depth being 1 $\mu$m, the dark current (Id) increases to about 80 nA when reverse bias is 10 V, and the dark current abruptly increases when reverse bias is more than 10 V. In the case of the diffusion depth being 3.5 $\mu$m, on the other hand, the dark current (Id) decreases to 15 nA when reverse bias is 10 V, and no breakdown takes place before reverse bias is 50 V (in the case of the diameter of the photo detecting area being 300 $\mu$m).

Incidentally, in the photodiode of FIG. 2, if it is intended to remove the InP window layer 24, the problems mentioned below occur.

The InGaAs photo-detecting layer constituting the uppermost layer must be provided with a p-n junction as there is no InP window layer. However, if the p-region is thin, the dark current becomes larger. If the p-region is not thin, however, high sensitivity cannot be obtained. Thus, the smaller the thickness of the light passing portion, the higher the detection sensitivity of the photodiode becomes. On the contrary, dark current becomes low as the diffusion depth increases.

The thickness of the light receiving portion of the p-InGaAs layer (corresponding to the portion designated by a reference numeral 5 in FIG. 1) formed by diffusing Zn in the InGaAs layer of said uppermost layer is now defined as d, and the diffusion depth is defined as L (see d, L in FIG. 1). The former has a relationship to light and the latter has a relationship to electricity. It is better to arrange that d has a small value and L simultaneously has a large value. It is further better to arrange that d is less than 2.0 $\mu$m and L is larger than 3.0 $\mu$m. However, in the prior art d is usually equal to L and therefore this is not possible and it has not been realizable to have L larger than d.

Regarding the thickness of the p-InGaAs, however, L and d may be set at mutually different positions. If the positions are different, the restriction of d=L can be removed.

After all, the center portion of the p-InGaAs layer may be reduced by a thickness tn (see FIG. 1). Reducing the film thickness in this manner is referred to as thickness reduction.

OBJECTS OF THE INVENTION

An object of the present invention is to provide an InGaAs/InP type PIN photodiode in which it is unnecessary to form any n-InP window layers (see the numeral 24 in FIG. 2) of the conventional example of FIG. 2. Thus, one difficult epitaxial process can be omitted to simplify the manufacturing process.

Another object of the present invention is to provide a photodiode in which a p-InGaAs layer (designated by the reference numeral 5 in FIG. 1) is partly removed to form a recess at which the thickness of the p-InGaAs layer is less than 2.0 $\mu$m. Thus, detection sensitivity can be improved.

A further object of the present invention is to provide a photodiode in which a p-type impurity is relatively deeply diffused into a part of an n-InGaAs layer (designated by the reference numeral 2 in FIG. 1) so that the thickness L of the p-InGaAs layer is larger than 3.0 $\mu$m. Thus, dark current can be lowered.

A still further object of the present invention is to provide a photodiode in which, instead of introducing the light on the n-InP substrate side (designated by the reference numeral 41 in FIG. 3) as in the conventional example of FIG. 3, light is introduced on the p-InGaAs layer side. Thus, a high sensitivity to a wider range of wavelengths between 0.6–1.65 $\mu$m is obtained. Reversely, in the conventional example of FIG. 3, the thickness of the n-InP substrate is so large that light having a wavelength shorter than 0.9 $\mu$m is absorbed therein to render the diode inoperable to the light having wavelengths of 0.6–0.9 $\mu$m. The diode of the present invention is operable in a wider range of wavelengths than the conventional example of FIG. 3 and therefore also applicable to a He-Ne laser beam (with a wavelength of 0.6328 $\mu$m), for example.

SUMMARY OF THE INVENTION

For attaining the above-mentioned objects, the arrangement of the present invention comprises an n-InP substrate 1 having one surface and an opposite surface, an n-electrode 8 provided on said one surface of the n-InP substrate, an n-InGaAs layer 2 formed by epitaxial growth on said opposite surface of the n-InP substrate 1, a p-InGaAs layer 5 formed by diffusing a p- type impurity in a part of said n-InGaAs layer 2, a ring-like p-electrode 4 provided on the p-InGaAs layer 5, the portion of the p-InGaAs layer 5 encircled by the ring-like p-electrode 4 being partly removed to form a recess 9, the thickness of the recessed portion of the p-InGaAs layer 5 being less than 2.0 μm, the thickness L of the p-InGaAs layer 5 under the p-electrode 4 being larger than 3.0 μm and light being introduced into said recess 9.

DESCRIPTION OF THE PREFERRED EMBODIMENT

Figure 1:
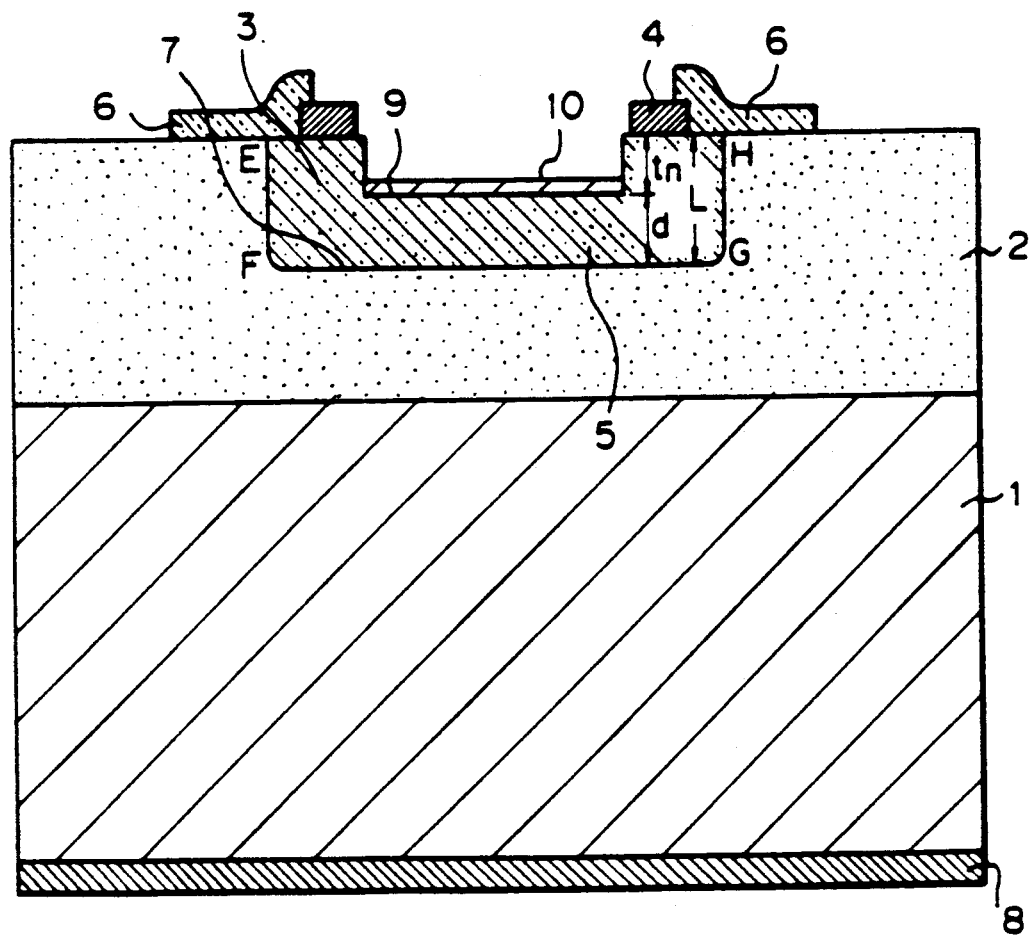
FIG. 1 is a sectional view showing the structure of an InGaAs/InP Type PIN photodiode of the present invention.
Figure 2:
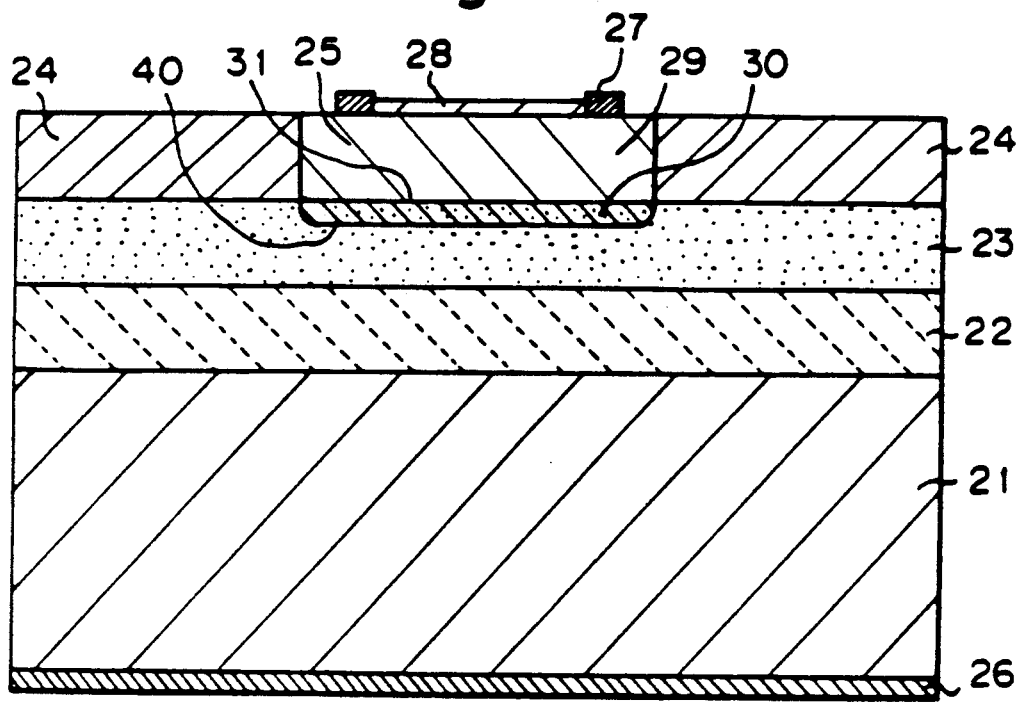
FIG. 2 is a sectional view of an InGaAs/InP Type PIN photodiode of a conventional example.
Figure 3:
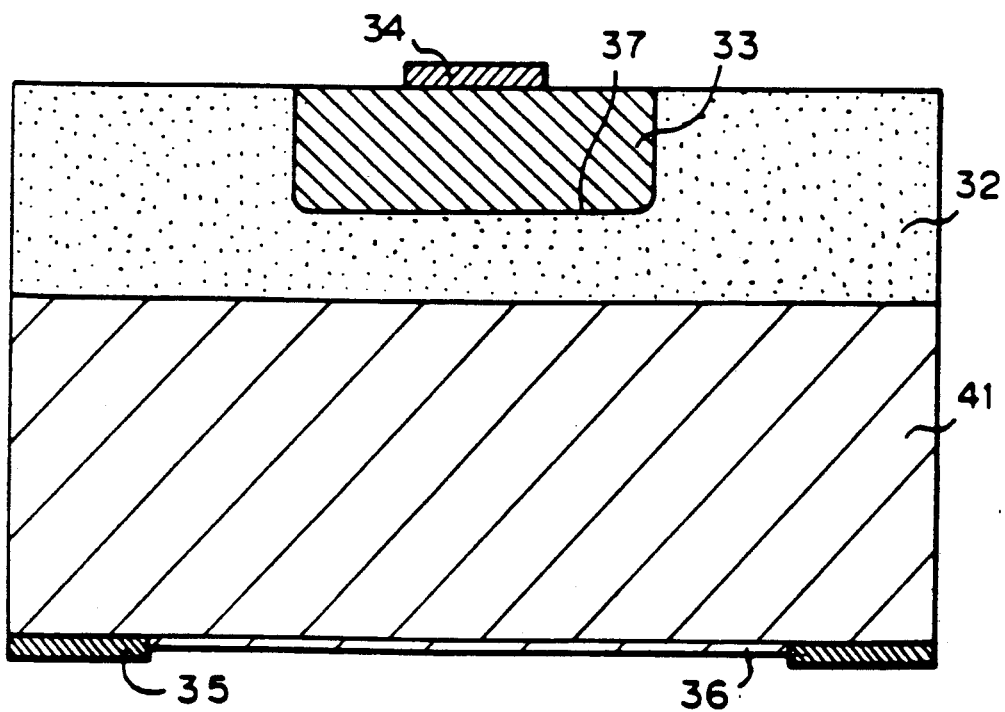
FIG. 3 is a sectional view of an InGaAs/InP Type PIN photodiode of another conventional example with light to be introduced on the substrate side.

The structure of the photodiode of the present invention will now be described with reference to FIG. 1.

An n-electrode 8 is provided by the vacuum evaporation process on the bottom surface of an n-InP substrate 1.

An n-InGaAs layer 2 is formed on the n-InP substrate 1 by the epitaxial growth method. In this embodiment, InGaAs consists of mixed crystals of InAs and GaAs and undergoes lattice matching with InP to form an epitaxially grown layer. Therefore, the mixture ratio of the crystal is determined, but its designation will be omitted herefrom for simplicity.

A Zn diffusion region 3 is formed on the mid-portion of the n-InGaAs layer 2.

The portion diffused with Zn changes from n-type to p-type. Zn is a p-type impurity and is doped with a higher concentration than that of the original n-type impurities of n-InGaAs to form a p-InGaAs layer 5. Zn is able to be replaced by another p-type impurity, for example, Be, Mg, Cd or the like.

Provided on the p-InGaAs layer 5 is a ring-like p-electrode 4 which is in ohmic contact therewith.

The Zn diffusion region 3 is not formed on the entire upper surface of the n-InGaAs layer 2, but only on its mid-portion. A p-n junction 7 is formed in a dish-like shape E, F, G and H. An upper end edge of the p-n junction 7 is exposed from the upper surfaces of the InGaAs layers 2 and 5. In order to obtain long lifetime, a passivation film 6, such as polymide film, is provided so as to cover the exposed upper end edge of the p-n junction 7.

It is important that the portion of the upper surface of the p-InGaAs layer 5 encircled by the p-electrode 4 is partly removed to form a recess 9.

The depth of the Zn diffusion region 3 from the upper surface is defined as L. Then, the distance dominating the dark current characteristic corresponds to L. The portion just under the p-electrode 4 can receive no light and thus generates no pairs of electrons and holes. The photo-detection sensitivity is controlled by the degree of excitation and recombination of the pairs of electrons and holes in the vicinity of the upper surface. Since the portion just under the p-electrode 4 receives no light, no excitation and recombination is caused at all. Therefore, the portion just under the p-electrode 4 having a large thickness does not lower detection sensitivity.

The depth of the recess 9 is defined as tn. The thickness d from the bottom surface of the recess 9 to the F-G region of the p-n junction 7 is determined as follows:

$$d = L - tn \qquad (1)$$

In order to improve the detection sensitivity, d must be reduced.

Incident light is absorbed by the p-InGaAs layer 5, a depletion layer following the p-n junction 7, and the n-InGaAs layer 2. Consequently, there are generated pairs of electrons and holes some of which drift to the electrodes 8 and 5 without recombining thereby generating photo-current.

Although it has vaguely been thought that d must be less than 0.5 μm as usual, the inventor has discovered by experiments that d may be up to 2.0 μm. Since the upper limit of d is increased, it is more easy to realize the structure of the photodiode of the present invention.

Thus, in the present invention, $$L \geq 3.0 \mu m \qquad (2)$$

$$d \leq 2.0 \mu m \qquad (3)$$

The depth of the recess 9 is properly as follows:

$$tn \geq 1.0 \mu m \qquad (4)$$

The recess 9 is a light incident portion and is therefore provided with an AR-film 10 for coating the light incident surface thereof. The formation of the AR-film is not necessarily needed, however.

The formation of the recess 9 (i.e., thickness reduction) is achieved by wet etching using a $H_3PO_4$ etchant, for example. A dry etching technique may alternatively be applicable.

The function will now be described.

A reverse bias is applied so that positive and negative voltages are applied to the n- and p-electrodes 8 and 4, respectively.

Light to be detected is introduced through the recess 9 into the p-InGaAs layer 5. Some of the photons may be absorbed in the vicinity of the surface. They generate pairs of electrons and holes, but there is a high possibility of these pairs being recombined and vanishing to generate no current.

Some of the photons may reach the depletion layer near the p-n junction 7 and be eventually absorbed therein. One photon generates one electron and hole pair. The electrons are accelerated under the influence of the electric field of the depletion layer and drift towards the n-InGaAs layer 2 and then diffuse through the n-InP substrate 1 into the n-electrode 8.

The holes are also accelerated under the influence of the electric field in the opposite direction and drift to in the vicinity of the p-electrode 4. The holes are combined with the electrons discharged from the p-electrode 4. Since the electrons circulate once in an external circuit, photo-current flows.

Since the thickness d of the mid-portion of the p-InGaAs layer 2 through which light passes is relatively small, sensitivity is high, and, on the other hand, since the diffusion depth L is relatively large, the rate of dark current is low.

SPECIFIC EMBODIMENT NO. 1

An undoped InGaAs photo-detecting layer 2 was deposited by about 6.5 μm thick on Sn doped InP substrate 1 by a liquid phase epitaxial growth (LPE) process.

Although InGaAs is undoped, it is an n-type semiconductor. Carrier drifting in this layer 2 is electrons. The electron density was less than $5 \times 10^{15}$ cm$^{-3}$.

Zn selective diffusion was performed by a sealed ampoul technique to form the p-InGaAs layer 5. The depth of the diffusion was 3.5 μm.

n- and p-electrodes 4 and 8 were formed by vacuum evaporation process and each of the electrodes was able to be in ohmic contact.

In order to form a recess 9 in the mid-portion of the p-InGaAs layer 5, the surface portion was removed by tn=2.5 μm by etching with the $H_3PO_4$ etchant resulting in L=3.5 μm, d=1.0 μm and tn=2.5 μm.

Figure 5:
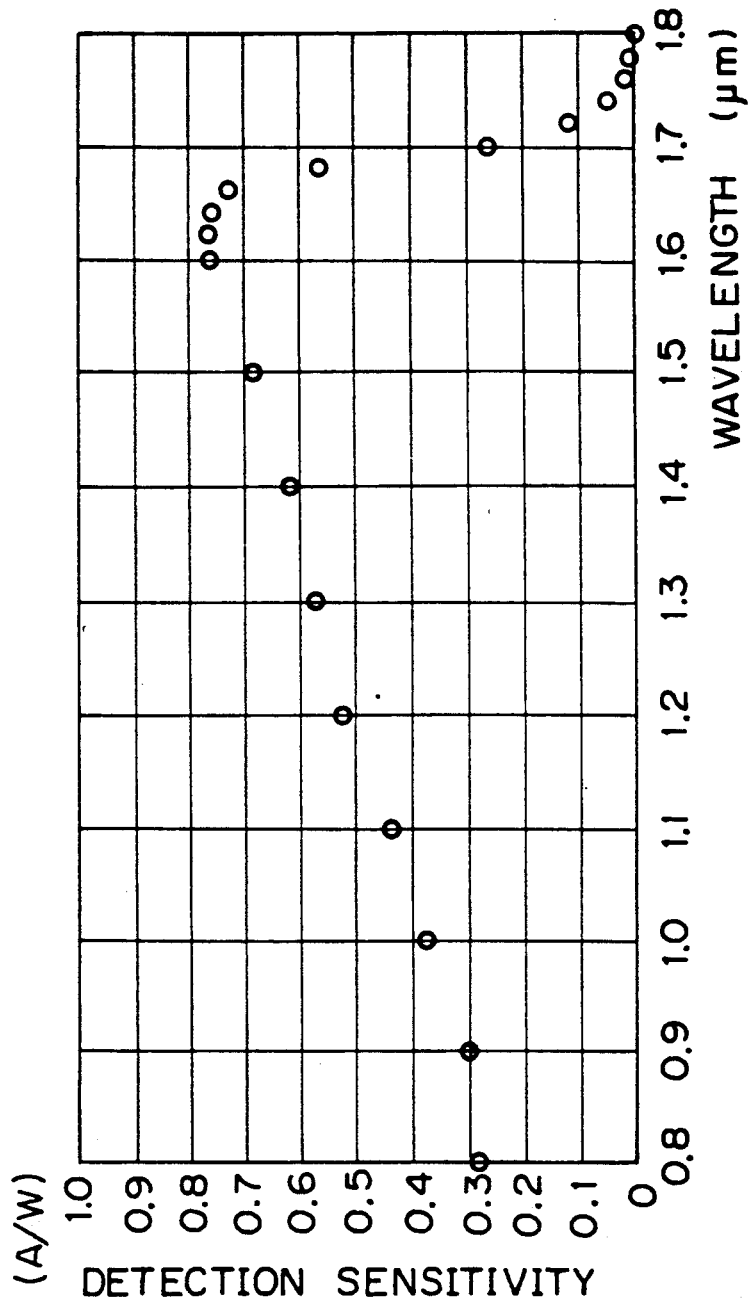
FIG. 5 is a graph showing the relationship between the wavelength and the measured values of the detection sensitivity of the photodiode (with no AR coating) of the present invention.
Figure 6:
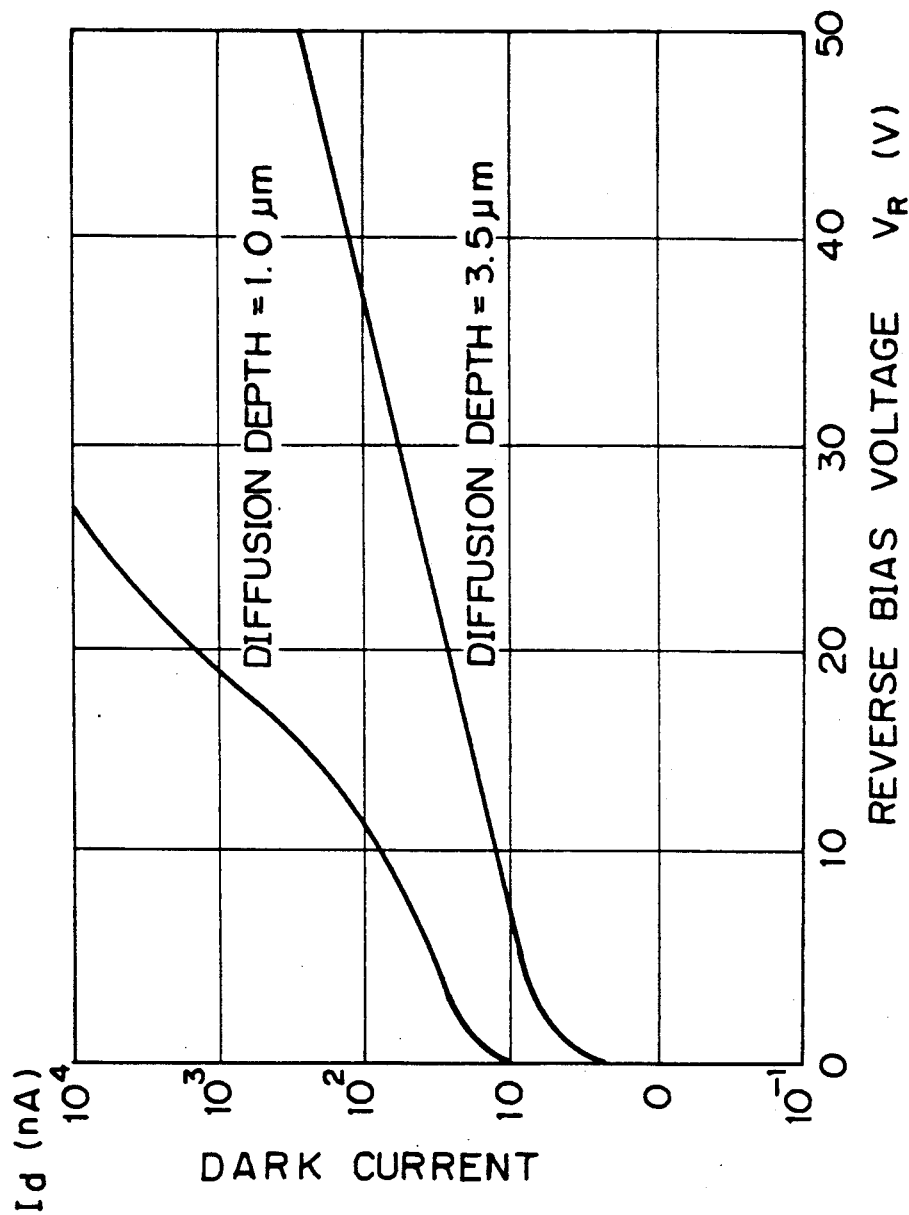
FIG. 6 is a graph showing the relationship between the dark current Id (nA) and the reverse bias voltage $V_R$ when the diffusion depth of the Zn diffusion region is 1 μm and 3.5 μm.

The spectral sensitivity characteristics of the photodiode so formed were measured. The result is shown in FIG. 5.

The abscissa designates wavelength (μm) of incident light and the ordinate designates the value (A/W) of the photo-current (A) divided by the energy (W) of the incident light.

At the wavelength of 1.3 μm, the sensitivity is 0.6 A/W and it is appreciated that the sensitivity is high. Up to the wavelength of 1.65 μm, high sensitivity is maintained. The sensitivity decreases to zero when the wavelength is larger than 1.7 μm is because the photons have an energy smaller than the band gap.

The detection sensitivity decreases as the wavelength becomes shorter, because the photon energy becomes larger as the wavelength becomes shorter. The quantum efficiency is almost constant within the range of 1.0–1.6 μm.

SPECIFIC EMBODIMENT NO. 2

Figure 4:
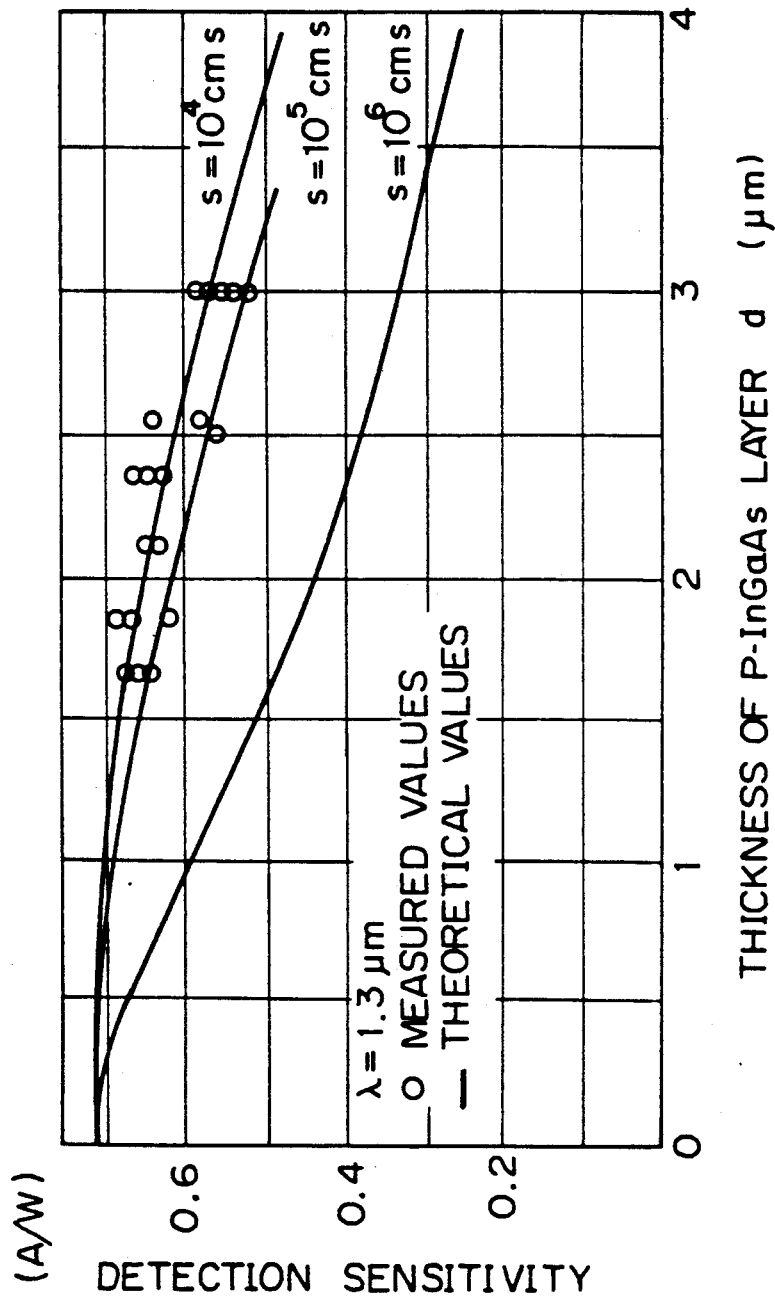
FIG. 4 is a graph showing the dependence of the measured and theoretical values of the detection sensitivity of the photodiode structure (with no AR coating) of the present invention on the thickness d of the p-InGaAs layer, the abscissa being the thickness (μm) of the p-InGaAs layer and the ordinate being the detection sensitivity (A/W)

The depth L of the Zn diffusion region was held constant and the depth tn of the recess 9 was varied as shown in FIG. 4 and sensitivity characteristics (A/W) were measured with respect to the light having a wavelength of 1.3 μm.

Varying tn means varying d, i.e., the effective depth of the p-InGaAs layer 5. d was varied from 1.7 μm to 2.6 μm, under the following conditions:

$L = 3.5 \mu m$, and $\lambda = 1.3 \mu m$

As a parameter, the surface recombination velocity S of the p-InGaAs layer 5 is set at $10^4$ cm/s, $10^5$ cm/s and $10^6$ cm/s. The round marks in FIG. 4 show the results of the experiments. The solid lines show calculated values.

Referring to FIG. 4, the detection sensitivity of 0.67 A/W is obtained at d=1.7 μm, and 0.69 A/W at d=1.9 μm. The calculated value at d=0.5 μm is over 0.7 A/W. If d is less than 2.0 μm, the sensitivity is substantially equal to that at d=0.5 μm, thereby high sensitivity being obtained.

The inventor's thought that a value of $d \leq 2.0$ μm is allowable, is based on the above-described fact.

According to the present invention, with respect to light having a wavelength of 1.3 μm, the maximum sensitivity of 0.7 A/W can be attained, even when no AR coating is provided.

What is claimed is:

1. An InGaAs/InP type PIN photodiode comprising an n-InP substrate having one surface and an opposite surface, an n-electrode provided on said one surface of the n-InP substrate, an n-InGaAs layer formed by epitaxial growth on said opposite surface of the n-InP substrate, a p-InGaAs layer of predetermined thickness formed by a diffusion of a p-type impurity in a part of said n-InGaAs layer, and a ring-like p-electrode provided on the p-InGaAs layer:

the portion of the p-InGaAs layer encircled by the ring-like p-electrode being partly removed to form a recess having a predetermined depth, the depth of the recess of the p-InGaAs layer being less than 2.0 μm, the thickness L of the p-InGaAs layer under the p-electrode being larger than 3.0 μm, and light being introduced into said recess.

2. An InGaAs/InP type PIN photodiode as set forth in claim 1, wherein an upper surface of said recess is provided with an antireflection film.

3. An InGaAs/InP type PIN photodiode as set forth in claim 1, wherein said recess comprises an etched recess that is etched with a $H_3PO_4$ aqueous solution.

4. An InGaAs/InP type PIN photodiode as set forth in any one of claims 1 to 3, wherein a passivation film is provided so as to cover an exposed end edge of a p-n junction which is formed between the n-InGaAs layer and the p-InGaAs layer.

5. An InGaAs/InP Type PIN photodiode as set forth in claim 1, wherein said p-type impurity is zinc (Zn).

6. An InGaAs/InP Type PIN photodiode as set forth in claim 1, wherein said p-type impurity is beryllium (Be).

7. An InGaAs/InP Type PIN photodiode as set forth in claim 1, wherein said p-type impurity is magnesium (Mg).

8. An InGaAs/InP Type PIN photodiode as set forth in claim 1, wherein said p-type impurity is cadmium (Cd).

* * * * *

UNITED STATES PATENT AND TRADEMARK OFFICE
CERTIFICATE OF CORRECTION

PATENT NO. : 5,053,837

DATED : October 1, 1991

INVENTOR(S) : Ichiro Tonai

It is certified that error appears in the above-identified patent and that said Letters Patent is hereby corrected as shown below:

On the title page: Item

[63], change "Continuation-in-part of Ser. No. 244,177, Sep. 14, 1987, abandoned." to --Continuation of Ser. No. 244,177, Sep. 14, 1988, abandoned.--

[30], change "63-231423" to --62-231423--

Signed and Sealed this

Fourteenth Day of June, 1994

Attest:

BRUCE LEHMAN

*Attesting Officer*          *Commissioner of Patents and Trademarks*